(12) United States Patent
Liimatainen

(10) Patent No.: US 6,370,364 B1
(45) Date of Patent: Apr. 9, 2002

(54) MOBILE STATION HAVING POWER CONTROL LOOP OFFSET ALIGNMENT WITHOUT REQUIRING RF POWER MEASUREMENT

(75) Inventor: Jukka Liimatainen, Oulu (FI)

(73) Assignee: Nokia Mobile Phones, Ltd., Espoo (FI)

( * ) Notice: Subject to any disclaimer, the term of this patent is extended or adjusted under 35 U.S.C. 154(b) by 0 days.

(21) Appl. No.: 09/338,197

(22) Filed: Jun. 22, 1999

(51) Int. Cl.$^7$ ................................................ H01Q 11/12
(52) U.S. Cl. ........................ 455/126; 455/115; 455/127
(58) Field of Search ................................ 455/126, 127, 455/115, 116, 117, 241.1; 330/129, 140, 85, 88, 89

(56) References Cited

U.S. PATENT DOCUMENTS

| | | | |
|---|---|---|---|
| 5,126,686 A | * 6/1992 | Tam | 330/134 |
| 5,214,393 A | * 5/1993 | Aihara | 455/116 |
| 5,276,917 A | 1/1994 | Vanhanen et al. | 455/89 |
| 5,376,895 A | * 12/1994 | Aihara | 330/129 |
| 5,434,537 A | 7/1995 | Kukkonen | 330/2 |
| 5,548,616 A | 8/1996 | Mucke et al. | 375/295 |
| 5,566,363 A | * 10/1996 | Senda | 455/126 |
| 5,697,074 A | * 12/1997 | Makikallio et al. | 455/126 |
| 5,724,003 A | * 3/1998 | Jensen et al. | 330/129 |
| 5,758,269 A | * 5/1998 | Wu | 455/126 |
| 5,781,069 A | * 7/1998 | Baskin | 330/149 |
| 5,884,149 A | * 3/1999 | Jaakola | 455/126 |

* cited by examiner

*Primary Examiner*—Dwayne Bost
*Assistant Examiner*—Sonny Trinh
(74) *Attorney, Agent, or Firm*—Harrington & Smith, LLP

(57) ABSTRACT

A method for determining a calibration value for a RF power control loop. The RF power control loop includes an error amplifier (30) having an output for outputting an indication (EAO) of a difference between an actual RF output power and a desired RF output power. The method includes steps of (a) commanding an RF output power; (b) measuring the output of the error amplifier; (c) comparing the measured output of the error amplifier to a reference value; and (d) iterating the steps of commanding, measuring and comparing. Generally, the reference value has a magnitude that is a function of an RF power amplifier gain control voltage. More particularly, the reference value has a magnitude that is less than a magnitude of the RF amplifier control voltage threshold level, above which the RF amplifier begins to output RF energy. In a preferred embodiment the reference value has a magnitude that is about one half of a magnitude of the RF amplifier control voltage threshold level above which the RF amplifier begins to output RF energy.

21 Claims, 5 Drawing Sheets

US 6,370,364 B1

MOBILE STATION HAVING POWER CONTROL LOOP OFFSET ALIGNMENT WITHOUT REQUIRING RF POWER MEASUREMENT

FIELD OF THE INVENTION

This invention relates generally to radiotelephones and, in particular, to radiotelephones, mobile stations and wireless communicators, including those capable of operation with a cellular network, that employ a closed loop transmitter power control system.

BACKGROUND OF THE INVENTION

The control of the RF transmitter power in a mobile station is an important consideration, as mobile stations are expected to operate at or very close to prescribed RF transmitter power levels. Furthermore, during a call the mobile station may be commanded by a base station to adjust the RF transmitter power. For example, if a mobile station in a vehicle begins a call with a relatively high power level at the edge of a particular cell, and then approaches the center of the cell, the mobile station will likely be required to decrease its RF transmitter power. Failure to properly control the transmitter power can result in, for example, an occurrence of dropped calls and/or the generation of interference that adversely affects other users. Transmitter power control is important in all types of wireless communication systems, including FM (analog) systems, as well as digital TDMA and CDMA systems.

Another important aspect of RF power control is an ability to completely turn off the RF transmitter when commanded or desired, thereby outputting, ideally, zero transmitted RF power.

FIG. 3 shows a simplified diagram of a conventional closed loop transmitter power control system of a type that is typically found in mobile stations. The closed loop transmitter power control system feeds an antenna through a directional coupled from an RF power amplifier. The RF power amplifier amplifies an input RF signal, which is modulated in some way with appropriate signalling information and, during a voice call, the user's voice. Data calls can be made in the same way (e.g., when a computer modem connects to a data communications network, such as the Internet). The purpose of the coupler 32 is to extract a small part of the transmitted RF energy and provide this energy to a detector, which functions to convert the RF output of the coupler to a DC signal having a magnitude that is a function of the output RF power level. The detector output signal is applied to one input of a closed loop error amplifier, which receives a power control voltage at another input. The power control voltage, which may be set by a controller (a microprocessor) using a digital to analog converter (DAC), is representative of a desired output RF power level. The output of the error amplifier is a difference between (i.e., the error) in the commanded RF output power level and the actual output RF power level, as reflected by the DC signal that is output from the detector. The error signal from the closed loop error amplifier is then used to control the gain of the RF amplifier, thereby closing the power control loop. When the output RF power level at the input to the antenna, as indicated at the output of the detector, equals the commanded RF power level, as indicated by the power control voltage output from the DAC, the closed loop has obtained equilibrium by setting the output of the error amplifier to a proper potential.

General reference in this regard can be made to the following commonly assigned U.S. Patents: U.S. Pat. No. 5,230,091 issued Jul. 20, 1993, entitled "Method And Apparatus For Tuning And Compensating Power Levels In A Radio Telephone", by Risto Vaisanen; U.S. Pat. No. 5,276,917 issued Jan. 4, 1994, entitled "Transmitter Switch-On In A Dual-Mode Mobile Phone" by Petteri Vanhanen et al.; U.S. Pat. No. 5,548,616, issued Aug. 20, 1996, entitled "Spread Spectrum Radiotelephone Having Adaptive Transmitter Gain Control" by Lars H. Mucke et al.; and U.S. Pat. No. 5,697,074 issued Dec. 9, 1997, entitled "Dual Rate Power Control Loop For A Transmitter" by Eero Makikallio et al.

Based on the foregoing discussion it can be appreciated that the overall calibration or alignment of the RF power control loop is an important consideration, particularly when making factory and field office calibrations. Typically expensive and complex test equipment, such as RF power meters and the like which also require periodic calibration, are required to actually measure the RF power output at various levels. The measured RF power is then compared to the expected (commanded) power, and calibration constants are derived and stored in a memory of the mobile station for later use. The calibration constants are used to null out any offsets in the RF power control loop circuitry, such as those exhibited by the DAC. In that the gain of the error amplifier is typically in the range of about 10 to 100,000, it can be appreciated that even a small offset voltage in the DAC's output can result in a large shift in the output of the closed loop error amplifier, thereby causing the actual RF transmitter power to deviate from the desired value.

Attention to other drift sources, namely the error amplifier and the power detector, can be considered as well. Additionally, the calibration constants are used to provide the desired output power levels. Typically, one of the constants indicates a "knee value" level that just sets the loop at equilibrium, but does not increase the RF output power. The other constants indicate the various desired output power levels. For a power ramp the output of the DAC is ideally ramped from the knee value level to the desired output power value, and then back to the knee value level for ramp down. The knee value, ideally, compensates the various loop offsets, while the other constants are usually defined with reference to the knee value. The knee value may thus also be referred to as a "base value".

As such, it can be appreciated that finding the knee value simplifies the task of determining the power level dedicated constants, as the latter can be simply added to the knee value. The power level dedicated constants then depend on the conversion coefficient of the DAC, the coupling factor and the impedance of the directional coupler, and the signal envelope sensitivity of the power detector. If these parameters are sufficiently constant, the calibration of the power level dedicated constants may not be required (depending, of course, on the accuracy requirement for the output power). In this case a calibration of the knee value may suffice, and predetermined values for the "add on" power level constants then applied. It can thus be appreciated that the knee value is a very sensitive parameter, and important in the sense that all power levels use it as a starting point for a power ramp.

With DACs incorporating some kind of level shifting circuitry, the output voltage drift with reference to a given input code may be considered as an offset drift of the DAC. More generally, however, the DAC output may be considered as simply drifting (not an offset drift per se) with temperature and aging. From the power control loop point of view this drift appears as an offset drift around the control voltage knee value, i.e., the value needed to set the loop just at equilibrium without causing an increase in the RF output power.

A small offset (or drift) in any of the relevant loop parameters near to the power control voltage knee value (such as at the start of a power ramp up or when using a small output power level) is detrimental. This is due to the typically very small detector voltage obtained under these conditions (for zero RF output power the envelope voltage component of the detector is zero, and increases with increasing RF power). In general, the directional coupler is a linear device and does not incorporate an offset or non-linearity error.

In order to be able to shut the RF power down completely, a "zero code" output of the DAC must be below a level defined by the detector bias voltage and the input offset of the loop error amplifier. The offset alignment procedure is run in order to determine a value for a digital control word that just balances the RF control loop, while not generating any significant RF output at the antenna.

The offset alignment is often done by adjusting the control word until a given low RF output level is obtained. The offset word is then estimated by deducting a predetermined amount of quantization steps from the word, yielding the desired RF power.

A partial solution to the offset drift problem can be obtained by specifying a low drift DAC, error amplifier, and power detector. An alignment of the power control voltage knee value will be needed, unless components with extremely good absolute accuracy can be used. However, this requires the use of more expensive components, which is not always desirable.

OBJECTS AND ADVANTAGES OF THE INVENTION

It is thus a first object and advantage of this invention to provide an improved method for calibrating or aligning the RF power control loop of a wireless communicator.

It is another object and advantage of this invention to provide an improved method for calibrating or aligning the RF power control loop of a wireless communicator, and which does not require that an RF power measurement be made.

It is a further object and advantage of this invention to provide an improved method for calibrating or aligning the RF power control loop of a wireless communicator, and that eliminates or reduces a need to provide external test equipment, such as RF power meters.

It is one additional object and advantage of this invention to provide novel embodiments of an RF power control loop that is capable of operating with a resident microprocessor for accurately determining the zero code for a DAC which generates a power control voltage, both for initial alignment purposes as well as for real time, long term drift compensation purposes.

It is another object and advantage of this invention to provide an improved method for calibrating or aligning the RF power control loop knee value.

SUMMARY OF THE INVENTION

The foregoing and other problems are overcome and the objects and advantages of the invention are realized by methods and apparatus in accordance with embodiments of this invention.

This invention provides a method and apparatus for aligning the knee voltage value of the RF power control loop. For this calibration no RF measurements or RF power meters are required. Finding the knee value has typically been a complex procedure and the most time consuming part of the RF power control loop calibration procedure. The teachings of this invention therefore aid the entire calibration process, as the power level dedicated constants are more readily calibrated after the knee voltage has been found. For a well designed power control loop the need to calibrate the power level constants depends on the accuracy of the power detector envelope sensitivity. Thus, the teachings of this invention may not alone eliminate the use of RF power meters for calibrating the power level constants, but makes this possible provided the loop components are sufficiently accurate.

A method is disclosed for determining a calibration value for a RF power control loop. The RF power control loop includes an error amplifier having an output for outputting an indication of a difference between an actual RF output power and a desired RF output power. The method includes steps of (a) commanding an RF output power; (b) measuring the output of the error amplifier; (c) comparing the measured output of the error amplifier to a reference value; and (d) iterating the steps of commanding, measuring and comparing until some predetermined number of iteration cycles has been completed.

A desired RF output power level may be zero, and the reference value has a magnitude that is a function of an RF power amplifier gain control voltage. More particularly, the reference value has a magnitude that is less than a magnitude of the RF amplifier control voltage threshold level (or knee level), above which the RF amplifier begins to output RF energy. In a preferred embodiment of this invention the reference value has a magnitude that is about one half of a magnitude of the RF amplifier control voltage threshold level above which the RF amplifier begins to output RF energy.

The step of commanding includes a step of applying a digital control word to an input of a digital to analog converter (DAC). The DAC has an output coupled to an input of the error amplifier, and another input of the error amplifier is coupled to the output of an output RF power detector.

In one embodiment of this invention the steps of measuring and comparing are performed by monitoring an output of a comparator circuit that has a first input coupled to the output of the error amplifier and a second input coupled to a voltage potential that is set at the reference value.

In another embodiment the step of measuring is performed by monitoring an output of an analog to digital converter (ADC) circuit that has an input coupled to the output of the error amplifier.

The steps of commanding, measuring, comparing and iterating can be performed during an initial manufacturing (factory) calibration of a wireless communicator, or they can be performed during an initial power-on sequence of the wireless communicator. In addition, the steps of commanding, measuring, and comparing can be performed between transmitted bursts of RF power, such as occur in TDMA systems.

In accordance with a presently preferred search algorithm, the step of iterating operates by continuously dividing a search range until the remaining search range is one DAC input control word quantization step, or some integer number of DAC quantization steps greater than one (for a lower accuracy requirement application).

BRIEF DESCRIPTION OF THE DRAWINGS

The above set forth and other features of the invention are made more apparent in the ensuing Detailed Description of the Invention when read in conjunction with the attached Drawings, wherein.

DETAILED DESCRIPTION OF THE INVENTION

Figure 1:
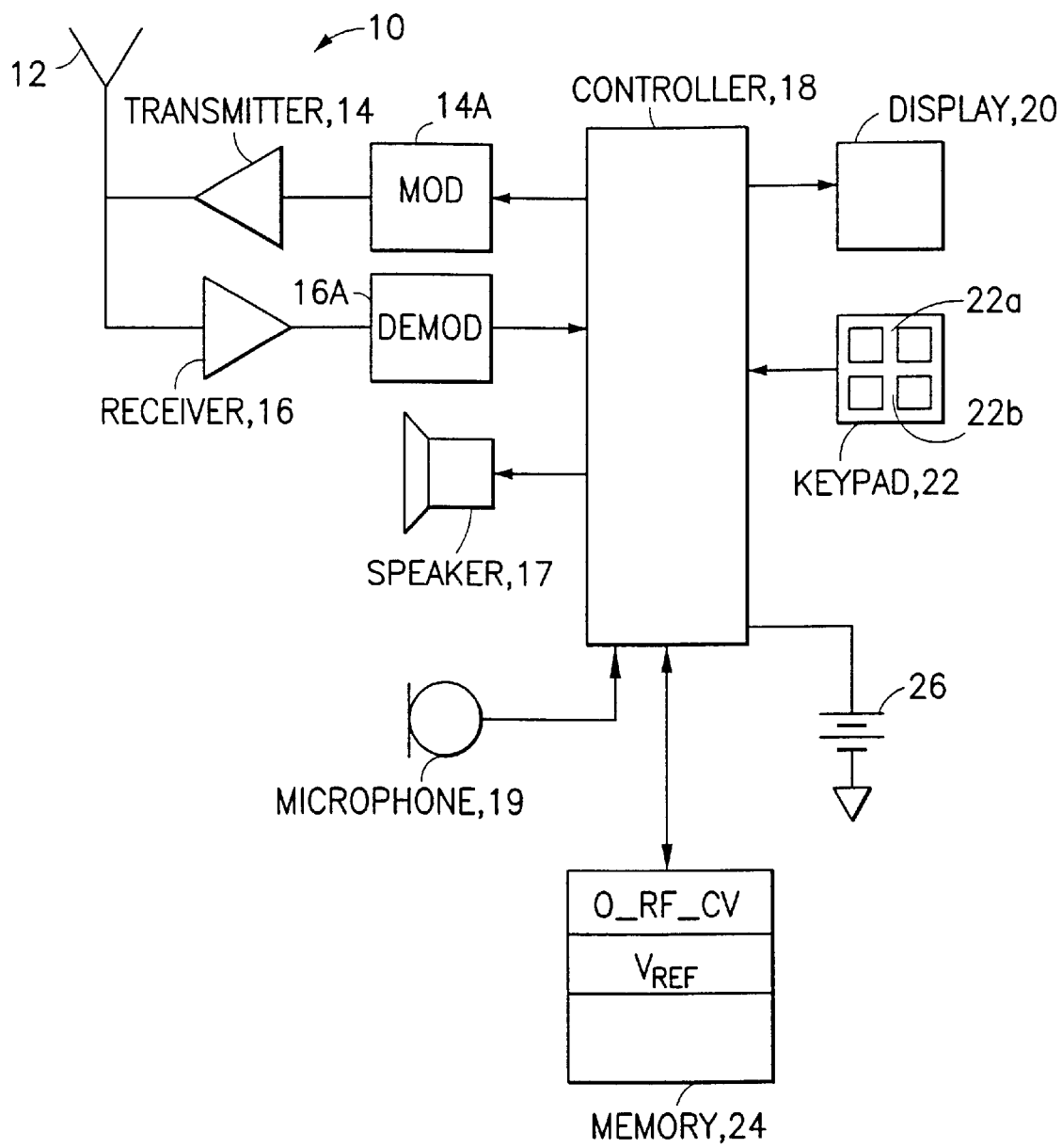
FIG. 1 is a block diagram of a mobile station that is constructed and operated in accordance with this invention.
Figure 2:
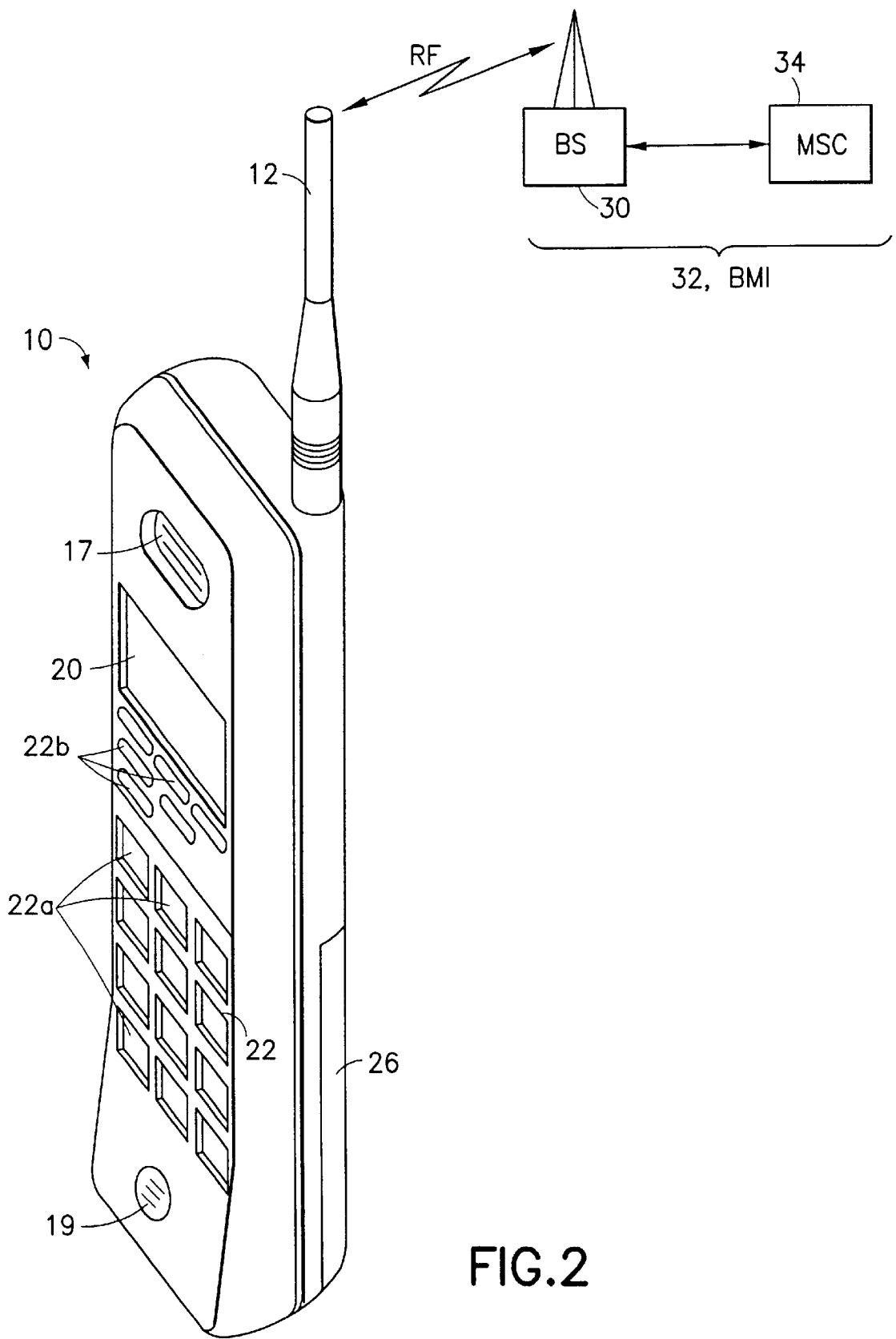
FIG. 2 is an elevational view of the mobile station shown in FIG. 1, and which further illustrates a wireless communication system to which the mobile station is bidirectionally coupled through RF links.

Reference is made to FIGS. 1 and 2 for illustrating a wireless user terminal or mobile station 10, such as but not limited to a cellular radiotelephone or a personal communicator, that is suitable for practicing this invention. The mobile station 10 includes an antenna 12 for transmitting signals to and for receiving signals from a base site or base station 30. The base station 30 is a part of a wireless network, such as one comprising a Base Station/Mobile Switching Center/Interworking function (BMI) 32 that includes a mobile switching center (MSC) 34. The MSC 34 provides a connection to landline trunks when the mobile station 10 is involved in a call.

The mobile station 10 includes a modulator (MOD) 14A, a transmitter 14, a receiver 16, a demodulator (DEMOD) 16A, and a controller 18 that provides signals to and receives signals from the transmitter 14 and receiver 16, respectively. These signals include signalling information in accordance with the air interface standard of the applicable wireless system, and also user speech and/or user generated data. The transmitter 14 and controller 18 are of most interest to the teachings of this invention, and are described in further detail below with reference to FIGS. 4 and 5.

It is understood that the controller 18 also includes the circuitry required for implementing the audio and logic functions of the mobile station. By example, the controller 18 may be comprised of one or more suitable data processor devices such as a digital signal processor device and a microprocessor device, and may also include various analog to digital converters, digital to analog converters, and other support circuits. The control and signal processing functions of the mobile station 10 are allocated between these devices according to their respective capabilities.

A user interface includes a conventional earphone or speaker 17, a conventional microphone 19, a display 20, and a user input device, typically a keypad 22, all of which are coupled to the controller 18. The keypad 22 includes the conventional numeric (0–9) and related keys (#,*) 22a, and other keys 22b used for operating the mobile station 10. These other keys 22b may include, by example, a SEND key, various menu scrolling and soft keys, and a PWR key. The mobile station 10 also includes a battery 26 for powering the various circuits that are required to operate the mobile station. The mobile station 10 also includes various memories, shown collectively as the memory 24, wherein are stored a plurality of constants and variables that are used by the controller 18 during the operation of the mobile station. For example, the memory 24 stores the values of various cellular system parameters and the number assignment module (NAM). An operating program for controlling the operation of controller 18 is also stored in the memory 24 (typically in a ROM device).

It should be understood that the mobile station 10 can be a vehicle mounted or a handheld device. It should further be appreciated that the mobile station 10 can be capable of operating with one or more air interface standards, modulation types, and access types. By example, the mobile station 10 may be capable of operating with any of a number standards, including analog (FM) standards such as AMPS, TDMA-based standard such as IS-136 and GSM, as well as CDMA-based standards such as IS-95 and similar standards. It should thus be clear that the teaching of this invention is not to be construed to be limited to any one particular type of mobile station or air interface standard.

The software stored in the memory 24 also includes routines for implementing the RF power control loop alignment method described below in relation to FIGS. 4 and 5.

This invention describes a method for power control loop offset alignment in the mobile station 10. In most if not all cases the mobile station 10 will include a digital to analog converter (DAC) for generating the power control voltage input to the closed loop RF transmitter power control system. A method of this invention detects the state of the error amplifier output, and does not require RF power measurements. The method can be used during production (factory) alignment tuning, as well as during real time applications in which case the loop offset made tolerant against long term drift effects. A digital control word yielding the desired offset is preferably determined iteratively by successive approximations. This is accomplished by detecting the loop error amplifier output level using the novel circuit arrangements described below.

Figure 3:
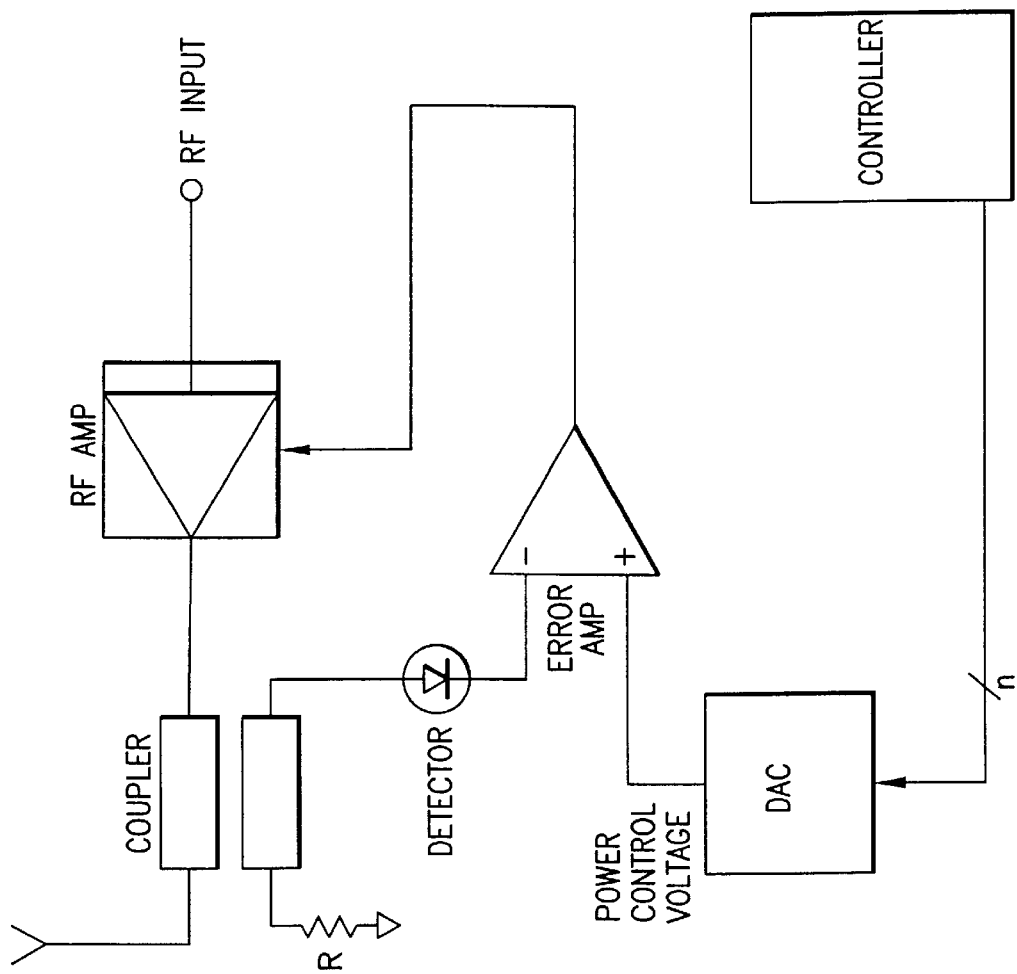
FIG. 3 is a simplified schematic diagram of a conventional RF power control loop.
Figure 4:
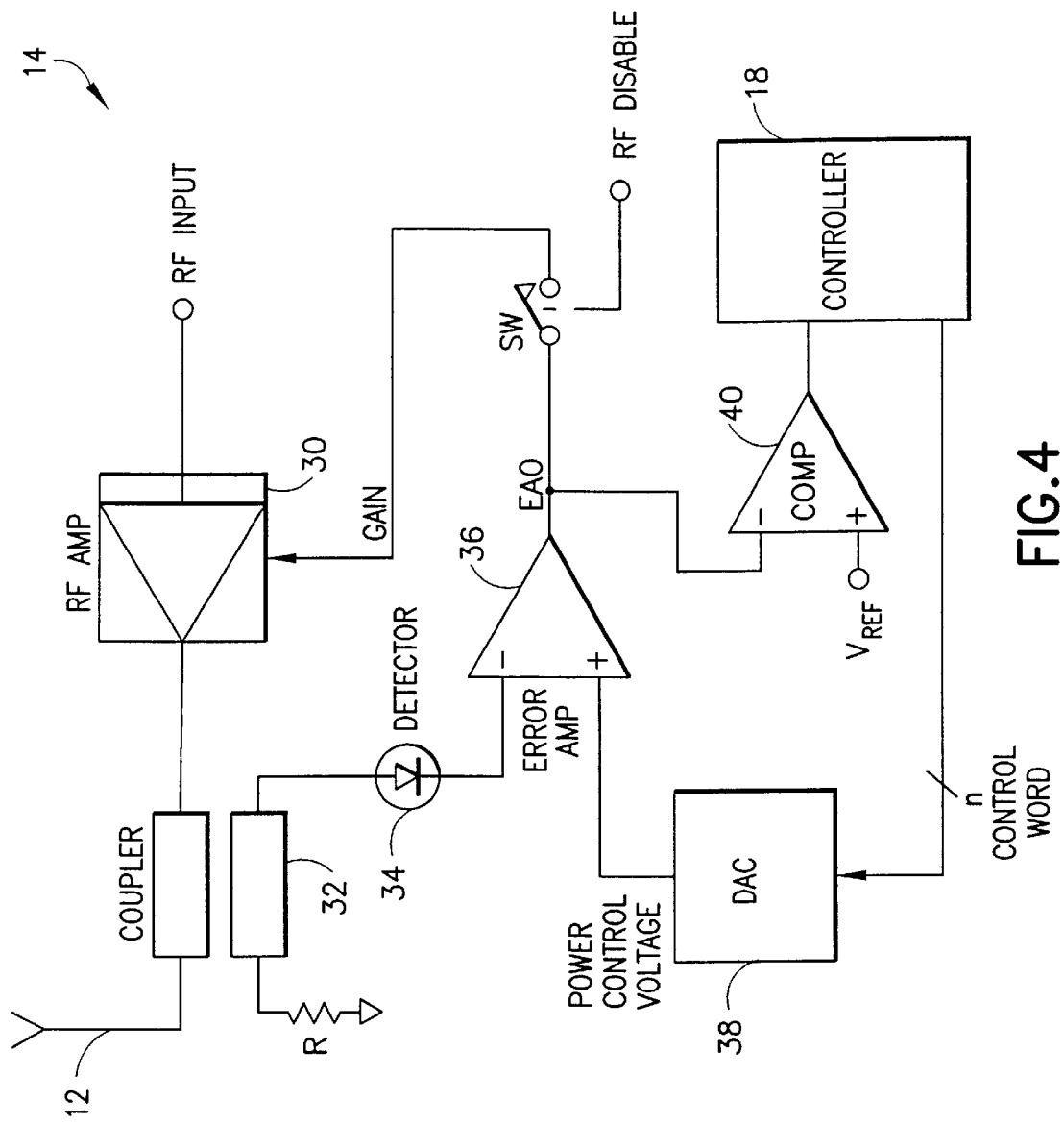
FIG. 4 is a simplified schematic diagram of an improved RF power control loop in accordance with a first embodiment of this invention.

FIG. 4 depicts a first embodiment of this invention. Briefly referring also to the previous discussion of FIG. 3, the transmitter 16 of the mobile station 10 includes the RF amplifier 30. The RF amplifier 30, shown as a single amplifier block, is typically comprised of one or more voltage controlled amplifiers (VGAs) followed by at least one RF power amplifier. An input Gain signal, output from the loop error amplifier 36, is typically applied to the one or more VGAs for controlling their output level. The output of the RF amplifier 30 is applied to the antenna 12 through the directional coupler 32. An output of the directional coupler 32 is provided to the detector 34, which outputs a DC signal to an input of the error amplifier 36. The DAC 38, which receives an n-bit control word from the controller 18, outputs the power control voltage to the other input of the loop error amplifier 36. The output of the loop error amplifier 36 (referred to herein as the error amplifier output or more simply as the EAO) can be applied through an optional switch (SW) to form the Gain signal at the input of the RF amplifier 30.

From the control word point of view the total RF power control loop offset is a combination of the conversion offset of the DAC 38, an input offset voltage of the loop error amplifier 36, and a voltage present at the detector 34 output due to detector bias current. In the following simplified analysis it is assumed that the gain of the error amplifier 36 is high.

As was discussed above, in order to be able to shut the RF power down completely the "zero code" output of the DAC 38 must be below a level defined by the detector 34 bias voltage and the input offset of the error amplifier 36. The task of the offset alignment procedure is to find a control word that just balances the RF control loop, while not generating any significant RF output, thereby determining the above-mentioned knee value.

As was also noted above, the offset alignment is often done by adjusting the control word until a given low RF output level is measured. The offset word is then estimated by deducting a predetermined amount of quantization steps from the word yielding the desired RF power.

This invention avoids the need for RF power measurements in the offset alignment tuning procedure, as well as the estimation of the amount of quantization steps to deduct. Errors due to power measurements and variations in RF power coupler 32 coupling factors, which should be taken into account when determining the number of quantization step deductions, are avoided as well.

In accordance with this invention, the RF power control loop offset alignment is accomplished using the resident controller 18 and memory 24, thereby eliminating the need to communicate with external test equipment and thus speeding up the alignment process.

It should be pointed out, however, that depending on the quality of the RF power control loop components, it may be desirable to make some RF power measurements in order to calibrate the output power. But, after the knee value control word is accurately determined in accordance with the teachings of this invention, the knee value control word can be readily increased by predetermined numbers of steps to obtain suitable RF levels for RF power levels calibration, which tends to speed up the entire calibration process. Furthermore in TDMA mobile stations (i.e., those transmitting in a burst mode) the teachings of this invention can be applied to align the RF output power offset in real time (e.g., between two consecutive bursts), in order to detect and compensate for long term offset-type drifts in the RF power control loop, including any bias voltage drift of the detector 34 and any drift of the DAC 38.

Further in this regard, and assuming typical values of 10 microvolts per degree Centigrade of error amplifier 36 offset, and 2 millivolts per degree Centigrade of power detector 34 offset, in addition to the characteristic thermally-related offset of the selected, typically unipolar DAC 38; the use of the real-time RF power control loop calibration made possible by the teachings of this invention enables the typically provided loop temperature compensation circuits to be eliminated, or at least for their temperature compensation requirements to be relaxed.

The reduction or elimination of these thermally related offsets and non-linearities is especially important when operating at low RF transmitter output power levels, where such offsets can have a proportionately larger effect on the transmitted RF power.

In accordance with the teachings of this invention, in the various embodiments of this invention circuitry is added to the basic RF power control loop of FIG. 3 so as to detect the state of the error amplifier output (EAO).

In the embodiment of FIG. 4 this circuitry is comprised of a comparator 40 having one input coupled to EAO and another input coupled to a reference voltage ($V_{REF}$) The reference voltage can be derived from another DAC, or from a zener diode or some similar voltage source. The output of the comparator 40 is coupled to an input of controller 18 (typically through a bit in a status register or the like), and a change of state of this bit indicates that EAO is higher or lower than $V_{REF}$.

Figure 5:
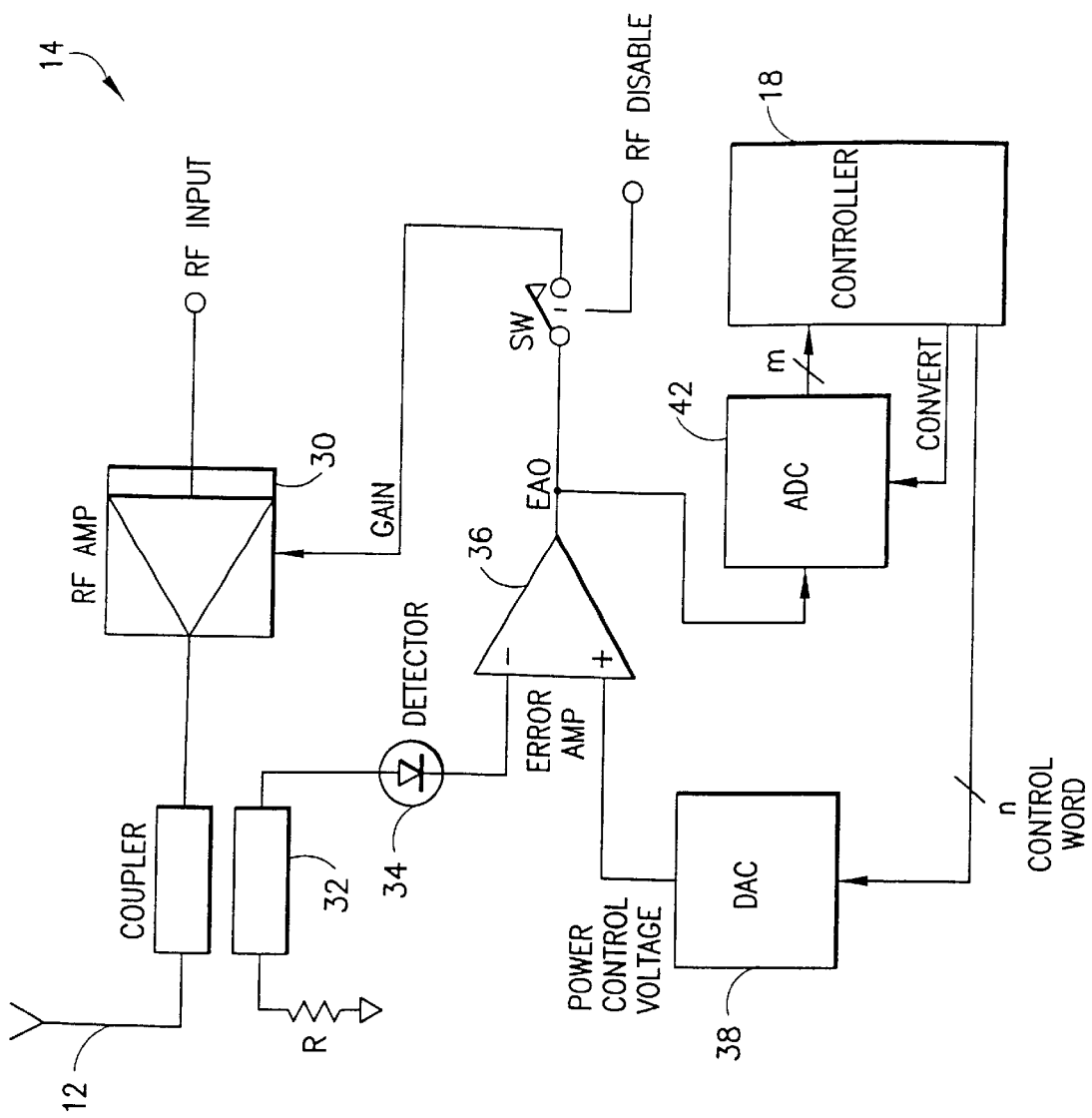
FIG. 5 is a simplified schematic diagram of an improved RF power control loop in accordance with a second embodiment of this invention.

In the embodiment of FIG. 5 the additional circuitry is comprised of an analog to digital comparator (ADC) 42 whose operation can be controlled using a Convert signal output from the controller 18. The ADC 42 has an input coupled to EAO. The m-bit output of the ADC 42 is coupled to an input of controller 18 (through bits in a status register or the like, or directly through a data bus). The m-bit output of the ADC 42 provides a digital representation of the magnitude of EAO. In this embodiment the comparison with $V_{REF}$ is done within the controller 18 by defining a suitable $V_{REF}$ reference digital code.

Both of these embodiments employ a measurement of the output of the loop error amplifier, and both embodiments are well suited for use in a factory alignment procedure.

If real time correction and compensation is to be implemented as well, then the switch (SW) is preferably provided in order to disable the RF output during the time the alignment is performed. Opening SW thus avoids the generation of an undesired RF transmission from the antenna 12.

The value of the voltage reference level ($V_{REF}$) in the embodiment of FIG. 4, or the value of the corresponding reference digital code in the embodiment of FIG. 5, depends on the control characteristics of the output power controlling device, or the controllable power amplifier 30 in this case. Typically no significant RF output is obtained from the RF amplifier 30 until the input control voltage (Gain) achieves some minimum threshold level. A suitable reference level ($V_{REF}$) is thus about one half of the amplifier 30 control voltage threshold level (or its equivalent ADC digital code.) As can be appreciated, the specific value of $V_{REF}$ is application dependent, and may best be determined after the turn-on threshold characteristics of the selected RF amplifier are known. This value may be stored in the memory 24, as is shown in FIG. 1.

In the case of FIG. 5, when the RF disable switch SW is included, the voltage reference value could be chosen to be in the middle of the EAO output swing. In this case, however, the choice is not critical, and the value explained above for the embodiment of FIG. 4 will work as well.

With the described embodiments of FIGS. 4 and 5 the alignment is preferably performed by iteratively searching for a proper knee value control word for the power control DAC 38. It is assumed that for the first factory alignment a variation range of the DAC input, that takes into account all relevant tolerances, is known. The search range is then chosen to be wider than, or at least equal to, the expected variation range. A first trial is done by providing to the DAC 38 an input code in the middle of the search range. If the error amplifier output (EAO) is found to be greater than the voltage reference level (FIG. 4) or reference code (FIG. 5) the proper DAC 38 input codeword will be found in the lower half of the original search range, whereas if EAO is found to be less than the voltage reference level or reference code the proper DAC 38 input codeword will be found in the upper half of the original search range. The next trial is performed in the middle of the indicated half of the search range, and so forth. This trial/comparison procedure continues iteratively by dividing the remaining search range until the remaining search range has decreased to one DAC 38 quantization step. If the original range was, for example, 256 steps, then eight iterations are needed as 256/2/2/2/2/2/2/2/2=1.

It is noted that one DAC quantization step has been found to obtain the best accuracy possible using the method of this invention. However, if less accuracy is sufficient the number of iterations can be reduced to obtain accuracies of +/−1 LSB, +/−2 LSB, +/−4 LSB, etc. (using integer numbers of DAC quantization steps greater than one). It is further noted that other algorithms could be employed. For example, one simple algorithm may begin the search at the bottom of the search range and then, for each DAC value, check the EAO. As soon as EAO increases from the lower limit value, the search is terminated and the current DAC value is stored.

For the real time drift tracking application the search range can be considerably reduced, as the device to device tolerances are assumed to have already been compensated for during the factory alignment, although at the initial power-on of the mobile station 10 a reduced range algorithm, similar to the factory alignment, may be desired. After the initial power-on the alignment long term drift can be tracked by testing the error amplifier output (EAO) from time to time, and changing the input codeword of the DAC 38 by, preferably, only one step between comparisons. The EAO comparisons are made between or just prior to transmit bursts (for the TDMA embodiment), and the power controlling device (e.g., the RF amplifier 30) is disabled using the switch (SW) to avoid a possibility of causing an unintended transmission which could interfere with the transmission from another user.

The end result is the storage of an RF power calibration value (0_RF_CV, or the knee value) in the memory 24 for use by the controller 18, as shown in FIG. 1.

While it is preferred to employ the already resident controller 18 for executing the method of this invention, an external computer connected to the output of the error amplifier 36, as in FIGS. 4 or 5, and to the DAC 38 through a suitable test interface, may be used as well.

Although described in the context of preferred embodiments, it should be realized that a number of modifications to these teachings may occur to one skilled in the art. Thus, while the invention has been particularly shown and described with respect to preferred embodiments thereof, it will be understood by those skilled in the art that changes in form and details may be made therein without departing from the scope and spirit of the invention.

What is claimed is:

1. A method for determining a calibration value for a RF power control loop that includes an error amplifier having an output for outputting an indication of a difference between an actual RF output power and a desired RF output power, comprising steps of:

commanding an RF output power;

measuring the output of the error amplifier with measurement circuitry that is coupled to the output of the error amplifier to provide a measured output of the error amplifier;

comparing the measured output of the error amplifier to a reference value; and iterating the steps of commanding, measuring and comparing.

2. A method as in claim 1, wherein the reference value has a magnitude that is a function of an RF power amplifier gain control voltage.

3. A method as in claim 1, wherein the reference value has a magnitude that is less than a magnitude of an RF amplifier control voltage threshold level, above which the RF amplifier begins to output RF energy.

4. A method as in claim 1, wherein the reference value has a magnitude that is about one half of a magnitude of an RF amplifier control voltage threshold level, above which the RF amplifier begins to output RF energy.

5. A method as in claim 1, wherein the step of commanding includes a step of applying a digital control word to an input of a digital to analog converter (DAC), the DAC having an output coupled to an input of the error amplifier, and another input of the error amplifier being coupled to the output of an output RF power detector.

6. A method as in claim 1, wherein the steps of measuring and comparing are performed by monitoring an output of a comparator circuit having a first input coupled to the output of the error amplifier and a second input coupled to a voltage potential set at the reference value.

7. A method as in claim 1, wherein the step of measuring is performed by monitoring an output of an analog to digital converter (ADC) circuit having an input coupled to the output of the error amplifier.

8. A method as in claim 1, wherein the steps of commanding, measuring, comparing and iterating are performed during an initial manufacturing calibration of a wireless communicator.

9. A method as in claim 1, wherein the steps of commanding, measuring, comparing and iterating are performed during an initial power-on sequence of a wireless communicator.

10. A method as in claim 1, wherein the steps of commanding, measuring, and comparing are performed between transmitted bursts of RF power.

11. A method for determining a calibration value for a RF power control loop that includes an error amplifier having an output for outputting an indication of a difference between an actual RF output power and a desired RF output power, comprising steps of:

commanding an RF output power;

measuring the output of the error amplifier;

comparing the measured output of the error amplifier to a reference value; and iterating the steps of commanding, measuring and comparing;

wherein the step of commanding includes a step of applying a digital control word to an input of a digital to analog converter (DAC), the DAC having an output coupled to an input of the error amplifier, and another input of the error amplifier being coupled to the output of an output RF power detector; and wherein the step of iterating operates by continuously dividing a search range until the remaining search range is one DAC input control word quantization step.

12. A wireless communicator comprising an RF power control loop comprised of an RF amplifier having an output controlled by a control voltage input, a coupler disposed at an output of said RF amplifier for directing a portion of the RF output to a power detector, and an error amplifier having a first input coupled to an output of said power detector and a second input coupled to a voltage potential representing a desired output power level of said RF amplifier, said error amplifier further comprising an output providing an output signal, said output being coupled to said control voltage input of said RF amplifier, and further comprising a circuit coupled to said output of said error amplifier for generating an indication of a magnitude of the output signal of said error amplifier and for providing the indication to a data processor.

13. A wireless communicator comprising an RF power control loop comprised of an RF amplifier having an output controlled by a control voltage input, a coupler disposed at an output of said RF amplifier for directing a portion of the RF output to a power detector, and an error amplifier having a first input coupled to an output of said power detector and a second input coupled to a voltage potential representing a desired output power level of said RF amplifier, said error amplifier further comprising an output providing an output signal, said output being coupled to said control voltage input of said RF amplifier, and further comprising a circuit coupled to said output of said error amplifier for generating an indication of a magnitude of the output signal of said error amplifier and for providing the indication to a data processor, wherein the circuit is comprised of a comparator circuit having a first input coupled to the output of the error amplifier and a second input coupled to a voltage potential set at a reference value, wherein the voltage potential representing the desired output power level of the RF amplifier is generated by a digital to analog converter (DAC), and wherein said data processor operates to determine, based on an output signal from said comparator circuit, a zero RF power level DAC input digital value.

14. A wireless communicator comprising an RF power control loop comprised of an RF amplifier having an output controlled by a control voltage input, a coupler disposed at an output of said RF amplifier for directing a portion of the RF output to a power detector, and an error amplifier having a first input coupled to an output of said power detector and a second input coupled to a voltage potential representing a desired output power level of said RF amplifier, said error amplifier further comprising an output providing an output signal, said output being coupled to said control voltage input of said RF amplifier, and further comprising a circuit coupled to said output of said error amplifier for generating an indication of a magnitude of the output signal of said error amplifier and for providing the indication to a data processor, wherein the circuit is comprised of an analog to digital converter (ADC) circuit having an input coupled to the output of the error amplifier, wherein the voltage potential representing the desired output power level of the RF amplifier is generated by a digital to analog converter (DAC), and wherein said data processor operates to determine, based on an output signal from said ADC and a reference value, a zero RF power level DAC input digital value.

15. A wireless communicator as in claim 13, wherein the reference value has a magnitude that is less than a magnitude of an RF amplifier control voltage threshold level, above which the RF amplifier begins to output RF energy.

16. A wireless communicator as in claim 14, wherein the reference value has a magnitude that is less than a magnitude of an RF amplifier control voltage threshold level, above which the RF amplifier begins to output RF energy.

17. A wireless communicator as in claim 13, wherein the reference value has a magnitude that is about one half level, above which the RF amplifier begins to output RF energy.

18. A wireless communicator as in claim 14, wherein the reference value has a magnitude that is about one half of a magnitude of an RF amplifier control voltage threshold level, above which the RF amplifier begins to output RF energy.

19. A wireless communicator as in claim 12, wherein said data processor is a component part of said wireless communicator.

20. A wireless communicator as in claim 12, wherein said data processor is disposed external to said wireless communicator.

21. A wireless communicator as in claim 12, and further comprising a switch coupled between said error amplifier output and said control voltage input of said RF amplifier, said switch being opened to disable said RF amplifier output when said circuit is used for calibrating said RF power control loop.

* * * * *

UNITED STATES PATENT AND TRADEMARK OFFICE
CERTIFICATE OF CORRECTION

PATENT NO.    : 6,370,364 B1
DATED         : April 9, 2002
INVENTOR(S)   : Liimatainen It is certified that error appears in the above-identified patent and that said Letters Patent is hereby corrected as shown below:

<u>Column 12,</u>
Line 14, after "that is about one half" insert -- of a magnitude of an RF amplifier control voltage threshold --

Signed and Sealed this

Third Day of September, 2002

*Attest:*

*Attesting Officer*

JAMES E. ROGAN
*Director of the United States Patent and Trademark Office*